US011251332B2

(12) United States Patent
Takeda et al.

(10) Patent No.: US 11,251,332 B2
(45) Date of Patent: Feb. 15, 2022

(54) METHOD FOR MANUFACTURING LIGHT-EMITTING ELEMENT

(71) Applicant: NICHIA CORPORATION, Anan (JP)

(72) Inventors: Mitsumasa Takeda, Tokushima (JP); Yuya Yamakami, Komatsushima (JP)

(73) Assignee: Nichia Corporation, Anan (JP)

( * ) Notice: Subject to any disclaimer, the term of this patent is extended or adjusted under 35 U.S.C. 154(b) by 85 days.

(21) Appl. No.: 16/689,594

(22) Filed: Nov. 20, 2019

(65) Prior Publication Data
US 2020/0168761 A1 May 28, 2020

(30) Foreign Application Priority Data
Nov. 26, 2018 (JP) .............................. JP2018-220264

(51) Int. Cl.
*H01L 33/00* (2010.01)
*H01L 33/38* (2010.01)
*H01L 33/44* (2010.01)
*H01L 33/62* (2010.01)
*H01L 25/075* (2006.01)

(52) U.S. Cl.
CPC ...... *H01L 33/0095* (2013.01); *H01L 25/0753* (2013.01); *H01L 2933/0033* (2013.01); *H01L 2933/0066* (2013.01)

(58) Field of Classification Search
CPC .............. H01L 33/0095; H01L 33/382; H01L 33/0093; H01L 33/44; H01L 33/62; H01L 25/0753; H01L 2933/0066; H01L 2933/0025; H01L 2933/0033
See application file for complete search history.

(56) References Cited

U.S. PATENT DOCUMENTS

| 2002/0195629 | A1* | 12/2002 | Okada ................... H01L 31/103 257/292 |
| 2004/0048448 | A1* | 3/2004 | Koike ................. H01L 21/0242 438/459 |
| 2006/0003551 | A1 | 1/2006 | Mancini et al. |

(Continued)

FOREIGN PATENT DOCUMENTS

| JP | 2011-82432 A | 4/2011 |
| JP | 2013-84999 A | 5/2013 |
| WO | WO 2006/007142 A2 | 1/2006 |

*Primary Examiner* — Caridad Everhart
(74) *Attorney, Agent, or Firm* — Birch, Stewart, Kolasch & Birch, LLP (57) ABSTRACT

A method for manufacturing a light-emitting element includes exposing a portion of an insulating layer from under a metal layer and a semiconductor layer by removing, through an opening of a resist layer, a portion of the metal layer and a portion of the semiconductor layer by wet etching using a first etchant, etching rates of the first etchant for the metal layer and the semiconductor layer each being higher than an etching rate of the first etchant for the insulating layer; removing the resist layer by wet etching after the removing of the metal layer portion and the semiconductor layer portion; and after the removing of the resist layer, removing a remaining portion of the metal layer while causing the insulating layer exposed from under the metal layer and the semiconductor layer to remain. The opening of the resist layer is positioned directly on the conductive layer.

17 Claims, 10 Drawing Sheets

(56) References Cited

U.S. PATENT DOCUMENTS

| | | | | |
|---|---|---|---|---|
| 2010/0155740 A1* | 6/2010 | Chinone | ............ | H01L 21/0242 |
| | | | | 257/76 |
| 2010/0304570 A1* | 12/2010 | Horie | ................. | H01L 21/3081 |
| | | | | 438/710 |
| 2012/0241805 A1* | 9/2012 | Shibata | ............... | H01L 33/0095 |
| | | | | 257/99 |
| 2015/0011057 A1* | 1/2015 | Zhou | ................ | H01L 29/66462 |
| | | | | 438/172 |
| 2015/0295137 A1* | 10/2015 | Pfeuffer | ................. | H01L 33/46 |
| | | | | 438/29 |
| 2015/0372208 A1* | 12/2015 | Chae | ...................... | H01L 33/38 |
| | | | | 257/98 |
| 2018/0061630 A1* | 3/2018 | Odnoblyudov | ... | H01L 29/42376 |

* cited by examiner

METHOD FOR MANUFACTURING LIGHT-EMITTING ELEMENT

CROSS-REFERENCE TO RELATED APPLICATION

This application claims priority to Japanese Patent Application No. 2018-220264, filed on Nov. 26, 2018, the disclosure of which is hereby incorporated by reference in its entirety.

BACKGROUND

The disclosure relates to a method for manufacturing a light-emitting element.

A method is disclosed in JP-A 2011-82432 (Kokai) in which a conductive layer and an insulating layer are formed at a surface of a semiconductor layer including a light-emitting layer on a side opposite to the light extraction surface; and subsequently, the semiconductor layer is singulated into multiple elements by etching, in the thickness direction of the semiconductor layer, a portion of the semiconductor layer from the light extraction surface side.

SUMMARY

The disclosure provides a method for manufacturing a light-emitting element that is excellent for the shape controllability of the semiconductor layer while simplifying the processes.

In a mode of the present invention, a method for manufacturing a light-emitting element includes preparing a structure body, the structure body including a base body, a conductive layer disposed above the base body, an insulating layer disposed on the conductive layer, a semiconductor layer disposed on the insulating layer and made of a nitride semiconductor, and a metal layer disposed on the semiconductor layer; forming a resist layer on the metal layer, the resist layer having an opening; exposing a portion of the insulating layer from under the metal layer and the semiconductor layer by removing, through the opening, a portion of the metal layer and a portion of the semiconductor layer by wet etching using a first etchant, etching rates of the first etchant for the metal layer and the semiconductor layer each being higher than an etching rate of the first etchant for the insulating layer; removing the resist layer by wet etching after the removing of the metal layer portion and the semiconductor layer portion; and after the removing of the resist layer, removing a remaining portion of the metal layer while causing the insulating layer exposed from under the metal layer and the semiconductor layer to remain. The opening of the resist layer is positioned directly on the conductive layer.

According to a method for manufacturing a light-emitting element in the disclosure, the shape controllability of the semiconductor layer is excellent while simplifying the processes.

DETAILED DESCRIPTION OF EMBODIMENTS

Embodiments will now be described with reference to the drawings. The same components in the drawings are marked with the same reference numerals.

Figure 1:
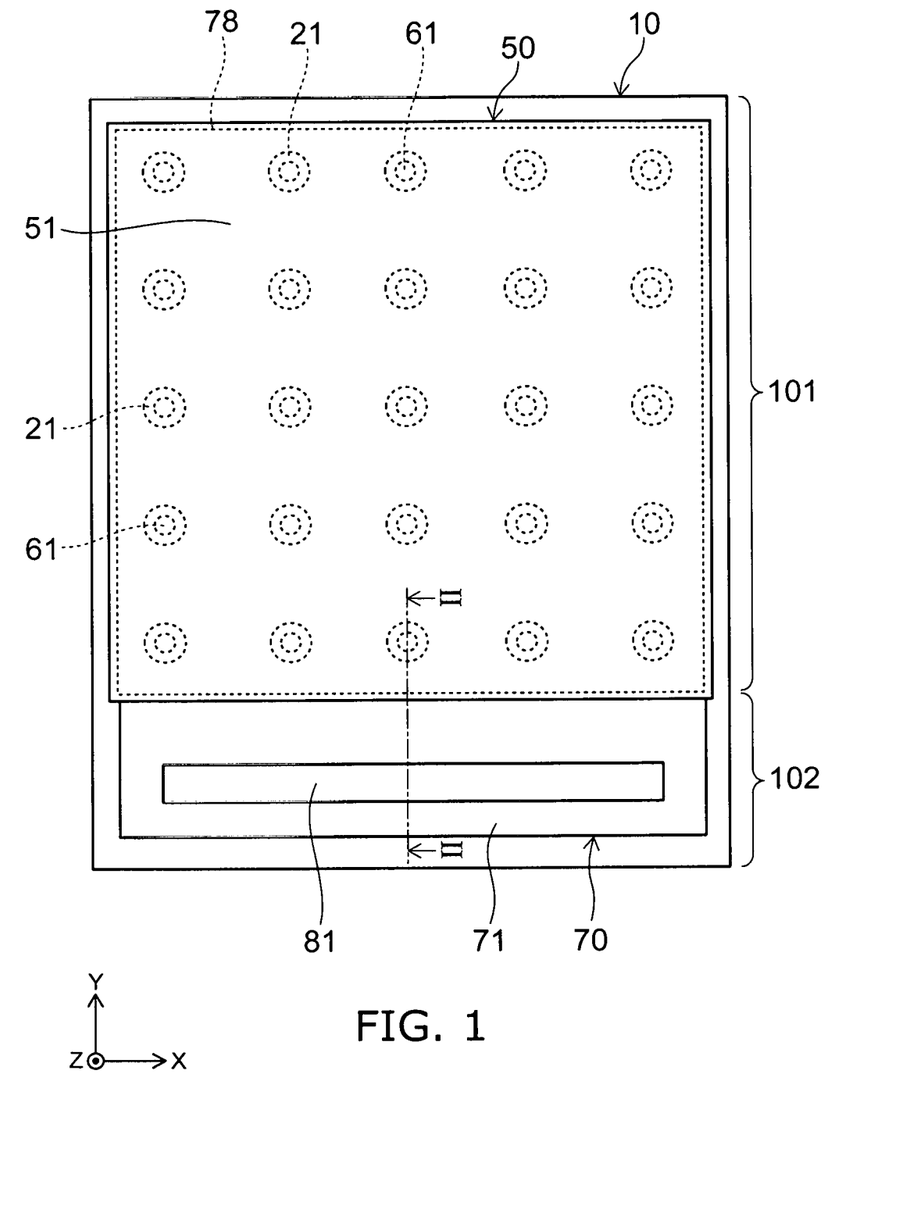
FIG. 1 is a schematic plan view of a light-emitting element of one embodiment of the invention.
Figure 2:
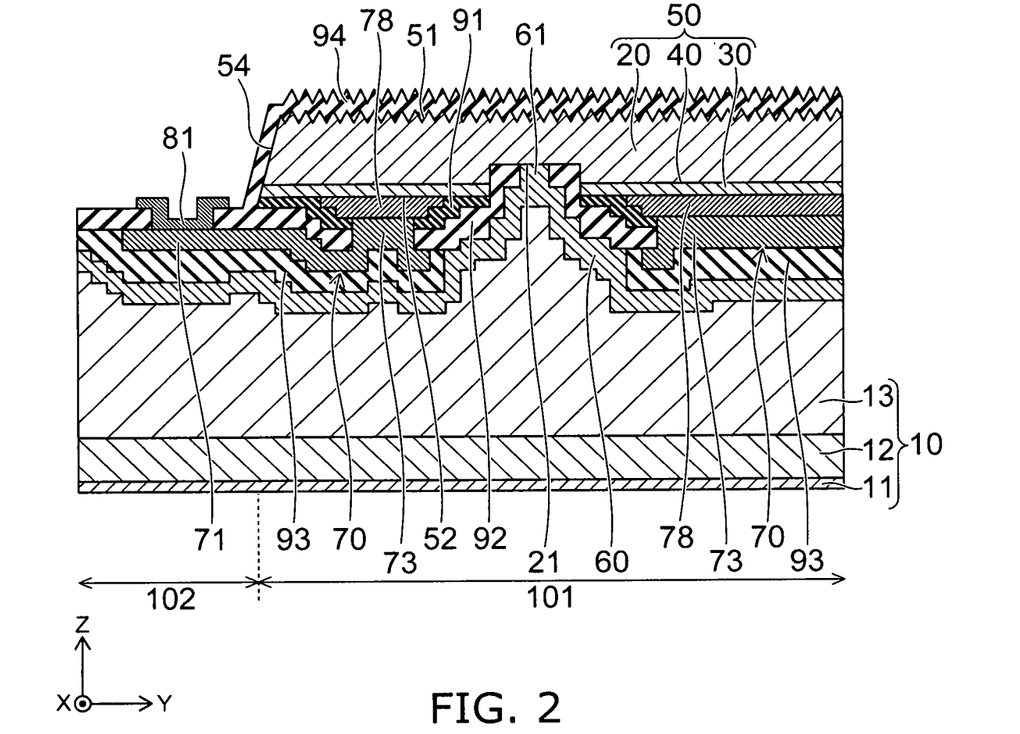
FIG. 2 is a II-II cross-sectional view of FIG. 1.

FIG. 1 is a schematic plan view of a light-emitting element of the embodiment. FIG. 2 is a II-II cross-sectional view of FIG. 1.

The light-emitting element of the embodiment includes a base body 10, a semiconductor layer 50, conductive layers 60, 70, and 78, insulating layers 91 to 93, and a pad electrode 81.

When the light-emitting element is viewed in top-view as shown in FIG. 1, the exterior form of the base body 10 is formed in a rectangular configuration; and the base body 10 includes two sides along an X-direction, and two sides along a Y-direction orthogonal to the X-direction. The base body 10 includes a first region 101 and a second region 102 adjacent to each other in the Y-direction.

As shown in FIG. 2, the semiconductor layer 50 is disposed above the base body 10. The semiconductor layer 50 is formed on the base body 10 with the insulating layers 91 to 93 interposed. A Z-direction is orthogonal to a plane including the X-direction and the Y-direction.

The first conductive layer 60, the second conductive layer 70, the third conductive layer 78, and the insulating layers 91 to 93 are disposed between the semiconductor layer 50 and the first region 101 of the base body 10. The semiconductor layer 50 is not disposed above the second region 102 of the base body 10. The pad electrode 81 is disposed above the second region 102 of the base body 10.

The base body 10 includes a fourth conductive layer 13, a substrate 12, and a back electrode 11 in order from the semiconductor layer 50 side. The back electrode 11 includes, for example, Pt. The substrate 12 is, for example, a silicon substrate. The fourth conductive layer 13 includes, for example, at least one selected from the group consisting of Al, Cu, Ti, Ni, Sn, and Pt. The base body 10 is conductive.

Figure 3:
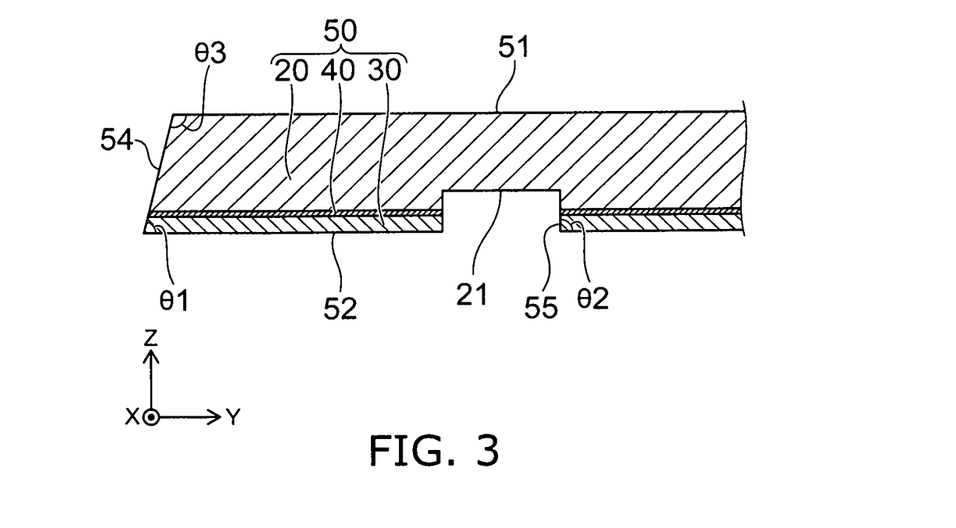
FIG. 3 is a schematic cross-sectional view of a semiconductor layer of the light-emitting element of one embodiment of the invention.

FIG. 3 is a schematic cross-sectional view of the semiconductor layer 50.

The semiconductor layer 50 includes an n-type semiconductor layer 20, a p-type semiconductor layer 30, and a light-emitting layer 40 disposed between the n-type semiconductor layer 20 and the p-type semiconductor layer 30. The semiconductor layer 50 includes, for example, a nitride semiconductor such as $In_xAl_yGa_{1-x-y}N$ ($0 \leq X$, $0 \leq Y$, and $X+Y<1$), etc.

For example, the n-type semiconductor layer 20, the light-emitting layer 40, and the p-type semiconductor layer 30 are epitaxially grown in order on a growth substrate.

Subsequently, a portion (a contact region 21) of the n-type semiconductor layer 20 is exposed from under the p-type semiconductor layer 30 and the light-emitting layer 40 by removing a portion of the stacked portion of the p-type semiconductor layer 30 and the light-emitting layer 40 by etching. The p-type semiconductor layer 30 and the light-emitting layer 40 remain in a mesa configuration when viewed in cross-section.

The semiconductor layer 50 has a first surface 51, and a second surface 52 positioned at the side opposite to the first surface 51 in the Z-direction. The first surface 51 is the surface of the n-type semiconductor layer 20 on the side opposite to the surface where the light-emitting layer 40 is disposed. The second surface 52 is the surface of the p-type semiconductor layer 30 on the side opposite to the surface where the light-emitting layer 40 is disposed.

The semiconductor layer 50 also has a first side surface 54 and a second side surface 55. One end of the first side surface 54 is continuous with the first surface 51; and the other end of the first side surface 54 is continuous with the second surface 52. Here, the one end of the first side surface 54 is the position where the first side surface 54 and the first surface 51 cross; and the other end of the first side surface 54 is the position where the first side surface 54 and the second surface 52 cross. The first side surface 54 includes the side surface of the n-type semiconductor layer 20, the side surface of the light-emitting layer 40, and the side surface of the p-type semiconductor layer 30; and the side surface of the n-type semiconductor layer 20, the side surface of the light-emitting layer 40, and the side surface of the p-type semiconductor layer are continuous between the first surface 51 and the second surface 52.

The second side surface 55 is the sidewall surface of a level-difference portion between the second surface 52 and the contact region 21 of the n-type semiconductor layer 20. The first side surface 54 is oblique to the first surface 51 and the second surface 52. An angle θ1 between the first side surface 54 and the second surface 52 is smaller than an angle θ2 between the second side surface 55 and the second surface 52 and less than 90°. Also, an angle θ3 between the first side surface 54 and the first surface 51 is larger than the angle θ1 and the angle θ2 and greater than 90°.

As shown in FIG. 2, the third conductive layer 78 is disposed at the second surface 52 of the semiconductor layer 50. The third conductive layer 78 includes, for example, at least one selected from the group consisting of Ag, Ni, Ti, and Pt.

Figure 4:
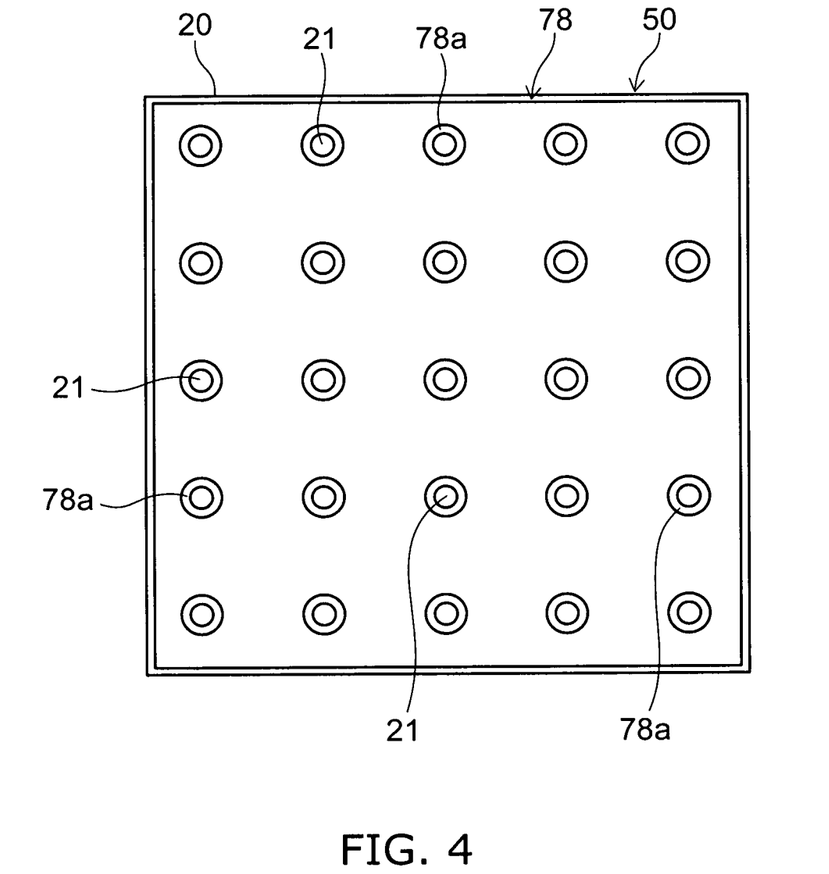
FIG. 4 is a schematic plan view of the semiconductor layer and a third conductive layer of the light-emitting element of one embodiment of the invention.

FIG. 4 is a schematic plan view illustrating mainly the arrangement relationship between the n-type semiconductor layer 20 and the third conductive layer 78.

The n-type semiconductor layer 20 includes multiple contact regions 21 having island configurations. The third conductive layer 78 has multiple openings 78a where the multiple contact regions 21 are exposed. When viewed in plan, the surface area of one opening 78a is greater than the surface area of one contact region 21.

As shown in FIG. 2, the insulating layer 91 covers a portion of the third conductive layer 78 and the surface of the p-type semiconductor layer 30. The insulating layer 91 is, for example, a silicon nitride layer. The insulating layer 92 covers the insulating layer 91 and the second surface 52 of the semiconductor layer 50. The insulating layer 92 is, for example, a silicon oxide layer.

The second conductive layer 70 and a portion of the first conductive layer 60 are disposed on the insulating layer 92. The first conductive layer 60 includes an n-contact portion 61 contacting the contact region 21 of the n-type semiconductor layer 20. The first conductive layer 60 is electrically connected to the n-type semiconductor layer 20 by the contact between the n-contact portion 61 and the contact region 21. The first conductive layer 60 includes, for example, at least one selected from the group consisting of Al, Si, Cu, and Ti.

The second conductive layer 70 includes a first portion 71 and a second portion 73. The second portion 73 is a p-contact portion contacting the third conductive layer 78. The third conductive layer 78 is disposed between the p-type semiconductor layer 30 and the second portion 73 of the second conductive layer 70 and electrically connects the second conductive layer 70 and the p-type semiconductor layer 30. The second conductive layer 70 includes, for example, at least one selected from the group consisting of Al, Si, Cu, and Ti. For example, the second conductive layer 70 may have a stacked structure of a Ti layer and an alloy layer including Al.

The first portion 71 of the second conductive layer 70 is disposed above the second region 102 of the base body 10. The pad electrode 81 is disposed on the first portion 71. The pad electrode 81 is disposed in the second region 102 not overlapping the semiconductor layer 50. The first portion 71 contacts the pad electrode 81 and electrically connects the second conductive layer 70 and the pad electrode 81.

The pad electrode 81 includes, for example, at least one selected from the group consisting of Ti, Pt, and Au. For example, the pad electrode 81 may have a stacked structure in which Ti, Pt, and Au are stacked in order from the semiconductor layer 50 side.

The first conductive layer 60 is disposed on the fourth conductive layer 13 of the base body 10 and contacts the fourth conductive layer 13. Accordingly, the n-type semiconductor layer 20 is electrically connected to the back electrode 11 via the n-contact portion 61, the first conductive layer 60, the fourth conductive layer 13, and the substrate 12.

In the Z-direction, the insulating layer 93 is disposed between the first conductive layer 60 and the second conductive layer 70. When viewed in plan, the insulating layer 93 insulates between the first conductive layer 60 and the second conductive layer 70 in a region where the first conductive layer 60 and the second conductive layer 70 overlap. The insulating layer 93 is, for example, a silicon oxide layer.

The first surface 51 of the semiconductor layer 50 is roughened; and an insulating layer 94 covers the first surface 51. An unevenness is formed also in the surface of the insulating layer 94. The insulating layer 94 also covers the first side surface 54 of the semiconductor layer 50. The insulating layer 94 is, for example, a silicon oxide layer.

For example, a wire is bonded to the pad electrode 81; and the back electrode 11 is bonded to a conductor portion of a mounting substrate. In other words, the light-emitting element shown in FIG. 2 is a vertically-conducting light-emitting element. Or, the base body 10 is not conductive; and the first conductive layer 60 on the n-side also may have a configuration connected to the outside by a pad electrode disposed above the base body 10.

A method for manufacturing the light-emitting element of the embodiment will now be described with reference to FIG. 5 to FIG. 11.

Figure 5:
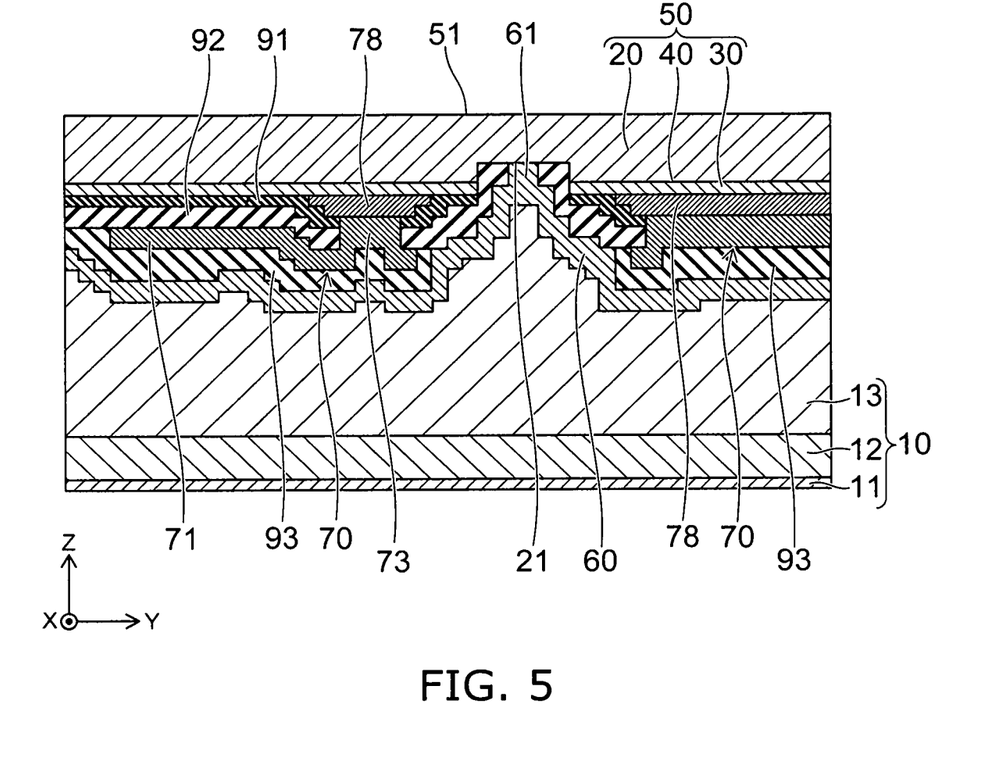
FIG. 5 to FIG. 11 are schematic cross-sectional views showing a method for manufacturing the light-emitting element of one embodiment of the invention.

FIG. 5 is a schematic cross-sectional view of a structure body including the base body 10 and the aforementioned components disposed on the base body 10.

Namely, the conductive layers 60, 70, and 78 and the insulating layers 91 to 93 are disposed on the base body 10. The semiconductor layer 50 is disposed on the insulating layer 91 and on the third conductive layer 78. The n-contact portions 61 which are portions of the first conductive layer 60 contact the contact regions 21 of the n-type semiconductor layer 20. When viewed in plan, the n-contact portions 61 are arranged in a matrix configuration. Thereby, the current is diffused in a wide area of the semiconductor layer 50; and the current density distribution of the semiconductor layer 50 can be improved.

Figure 6:
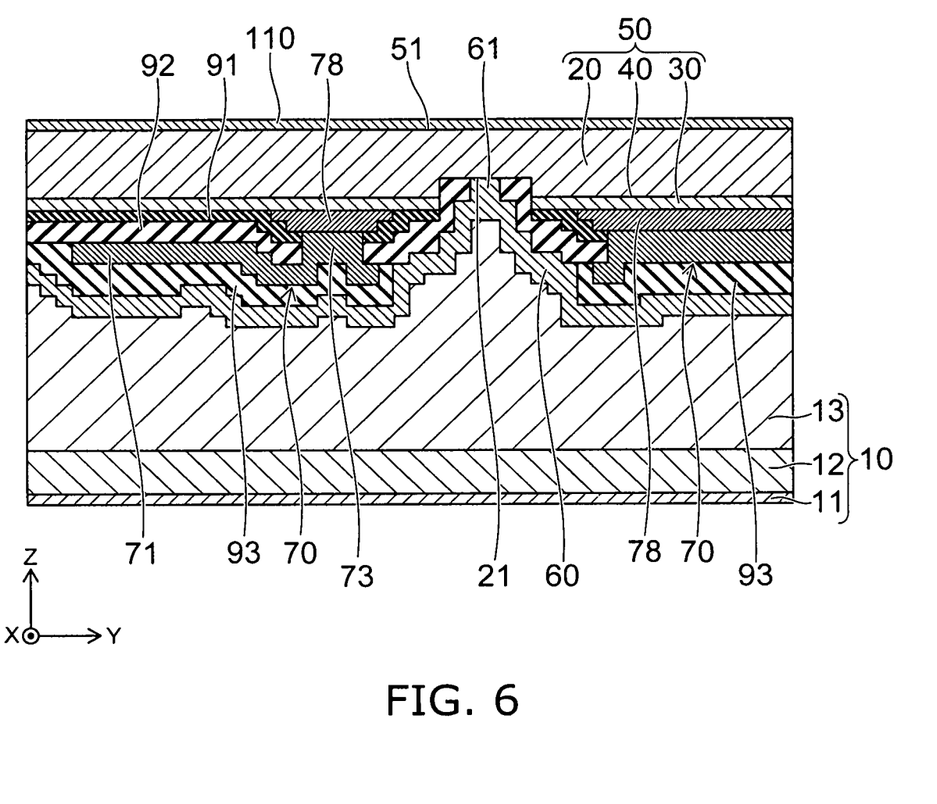

As shown in FIG. 6, a metal layer 110 is formed on the first surface 51 of the semiconductor layer 50. The metal layer 110 is formed on the entire surface of the first surface 51. For example, the metal layer 110 is made of Ti.

Figure 7:
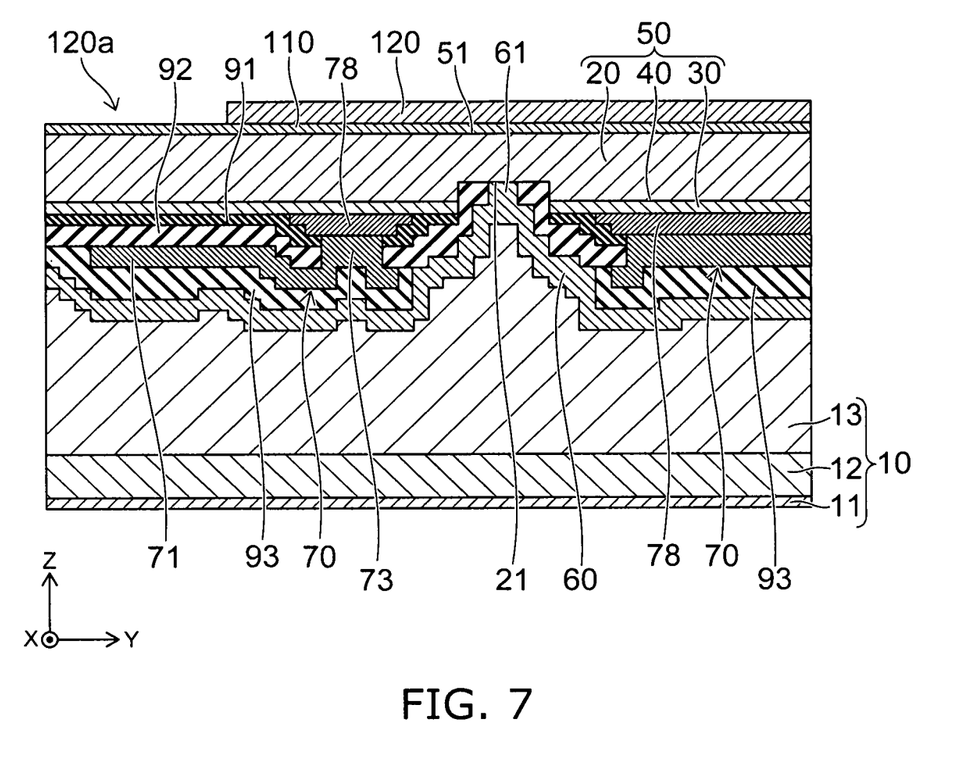

As shown in FIG. 7, a resist layer 120 that has an opening 120a is formed on the metal layer 110. The opening 120a is formed in the resist layer 120 by exposing and developing after forming the resist layer 120 on the entire surface of the metal layer 110.

A portion of the metal layer 110 is exposed in the opening 120a. The opening 120a is formed to be positioned directly on the first portion 71 of the second conductive layer 70.

A portion of the metal layer 110 and a portion of the semiconductor layer 50 below the opening 120a are etched using the resist layer 120 as a mask. The metal layer 110 and the semiconductor layer 50 are etched by wet etching using a first etchant.

In the wet etching using the first etchant, the etching rate for the metal layer 110 and the etching rate for the semiconductor layer 50 each are higher than the etching rate for the insulating layer 92.

For example, a liquid that includes phosphoric acid as the first etchant is used for the combination of the insulating layer 92 which is a silicon oxide layer, the metal layer 110 which is a Ti layer, and the semiconductor layer 50 which is a nitride semiconductor layer.

First, a portion of the metal layer 110 exposed at the opening 120a is removed by the first etchant; and after the portion of the metal layer 110 is removed, the first surface 51 of the semiconductor layer 50 is exposed in the opening 120a. Continuing, the etching progresses from the exposed first surface 51 in the thickness direction of the semiconductor layer 50 due to the first etchant; and the semiconductor layer 50 is removed.

For etching conditions in which the first etchant including phosphoric acid is used, the etching for the insulating layer 91 which is the silicon nitride layer also is higher than the etching rate for the insulating layer 92 which is the silicon oxide layer; therefore, a portion of the insulating layer 91 below the opening 120a also is removed.

Figure 8:
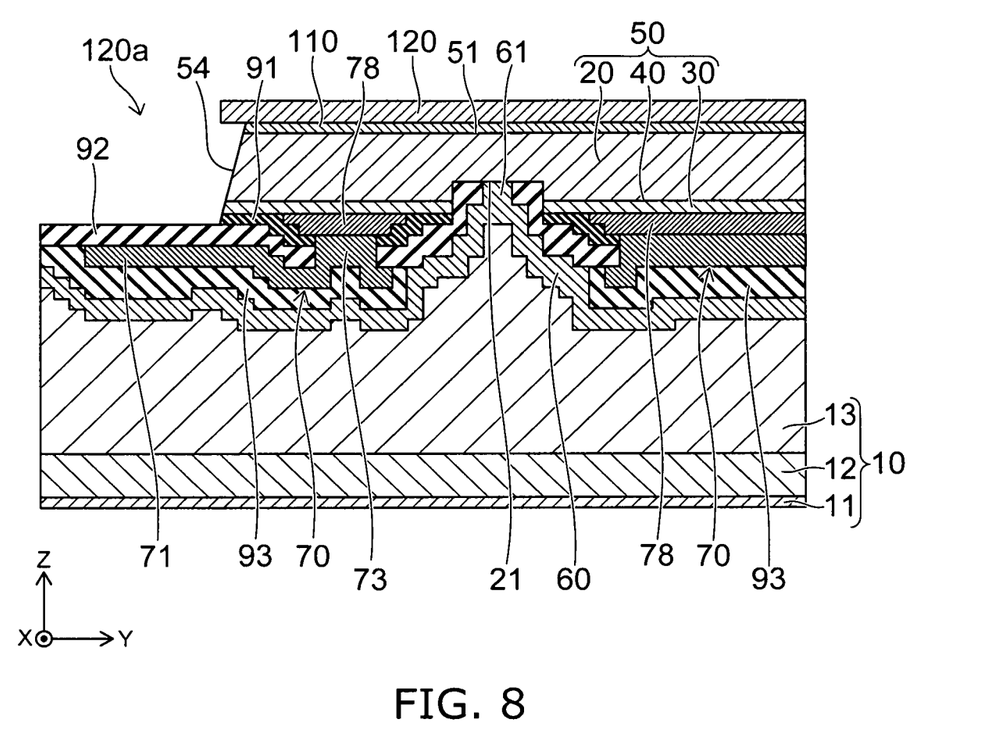

A portion of the insulating layer 92 is exposed as shown in FIG. 8 by removing a portion of the metal layer 110, a portion of the semiconductor layer 50, and a portion of the insulating layer 91 below the opening 120a. By the etching, the semiconductor layer 50 is singulated into multiple elements in, for example, a lattice configuration in the XY plane; and the first side surface 54 is formed at the end portion of the semiconductor layer 50 corresponding to one element. Because the etching of the metal layer 110 and the semiconductor layer 50 progresses without etching of the resist layer 120 progressing, a portion of the side surface of the metal layer 110 and the semiconductor layer 50 is positioned further inward than the side surface of the resist layer 120.

Here, as a comparative example, an etching mask layer is formed on the semiconductor layer 50; an opening is formed in the mask layer by patterning the mask layer using a resist layer; and subsequently, the semiconductor layer 50 is etched using the mask layer having the opening. In such a case, the patterning fluctuation of the mask layer affects the patterning fluctuation of the semiconductor layer 50.

According to the embodiment, both the metal layer 110 and the semiconductor layer 50 are etched using the same first etchant. When etching the semiconductor layer 50, the metal layer 110 functions not as a mask but as an adhesion layer that is interposed between the semiconductor layer 50 and the resist layer 120 and increases the adhesion between the two. The opening 120a is formed in the resist layer 120 with high precision by photolithography. Then, the semiconductor layer 50 is patterned using the resist layer 120 as a mask.

The metal layer 110 that is disposed between the resist layer 120 and the semiconductor layer 50 has a higher adhesion force to the semiconductor layer 50 than the adhesion force between the resist layer 120 and the semiconductor layer 50. The adhesion force between the metal layer 110 and the semiconductor layer 50 is higher than the adhesion force between the resist layer 120 and the semiconductor layer 50. Therefore, side etching (over-etching) of the semiconductor layer 50 at the interface between the metal layer 110 and the semiconductor layer 50 due to penetration of the first etchant can be suppressed; and the shape controllability of the first side surface 54 of the semiconductor layer 50 is excellent.

Figure 9:
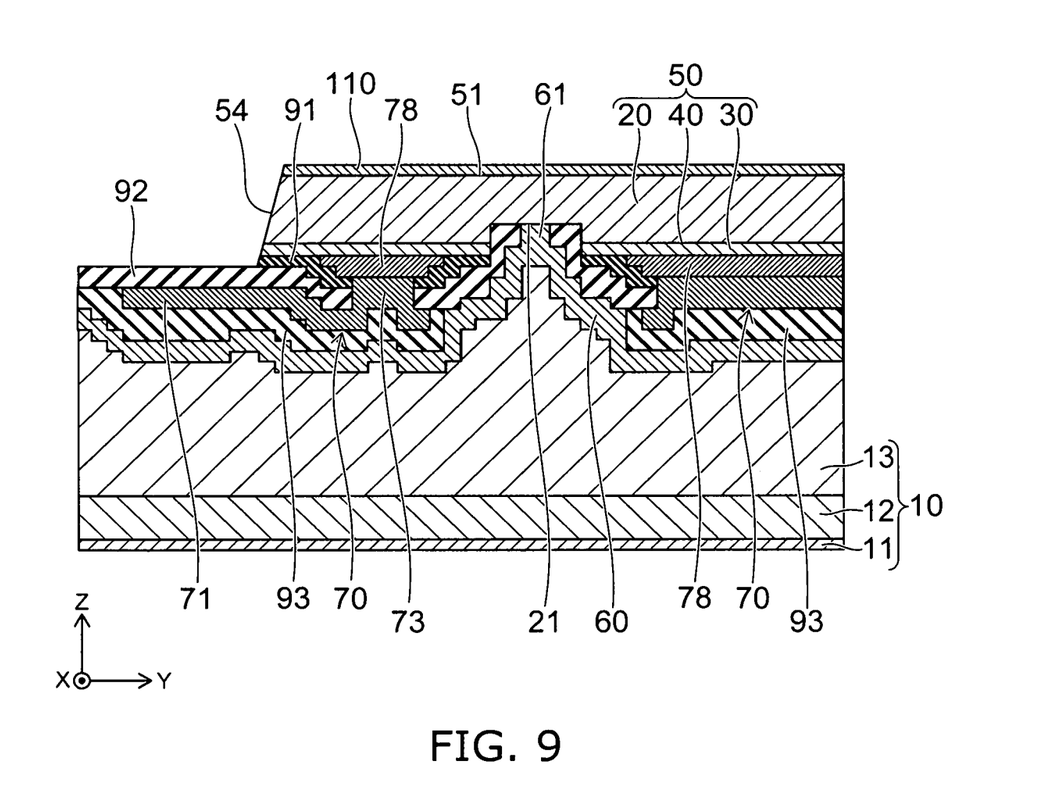

The resist layer 120 is removed by wet etching after the process of removing the portion of the metal layer 110 and the portion of the semiconductor layer 50. The resist layer 120 is removed; and the upper surface of the metal layer 110 is exposed as shown in FIG. 9.

After the process of removing the resist layer 120, the metal layer 110 is removed while causing the portion of the insulating layer 92 exposed from under the metal layer 110 and the semiconductor layer 50 to remain. In the process of removing the metal layer 110, the second etchant is used so that the etching rate for the metal layer 110 is higher than the etching rate for the insulating layer 92. For example, in the case where the metal layer 110 includes a Ti layer, an aqueous solution that includes sulfuric acid and aqueous hydrogen peroxide is used as the second etchant.

Figure 10:
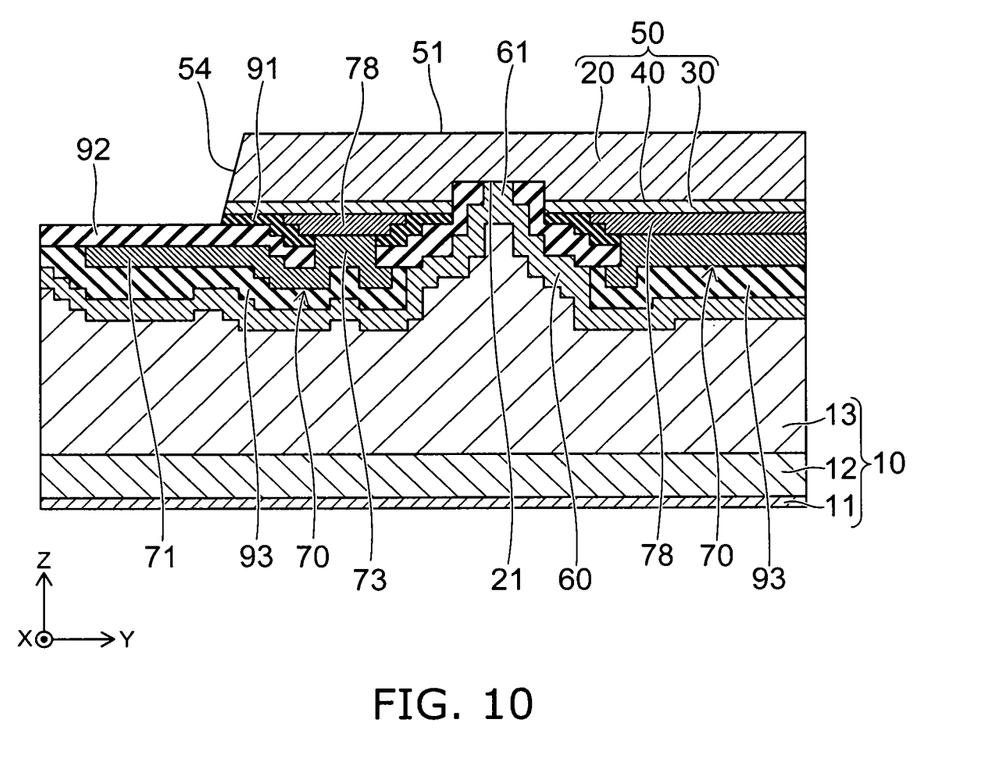
Figure 11:
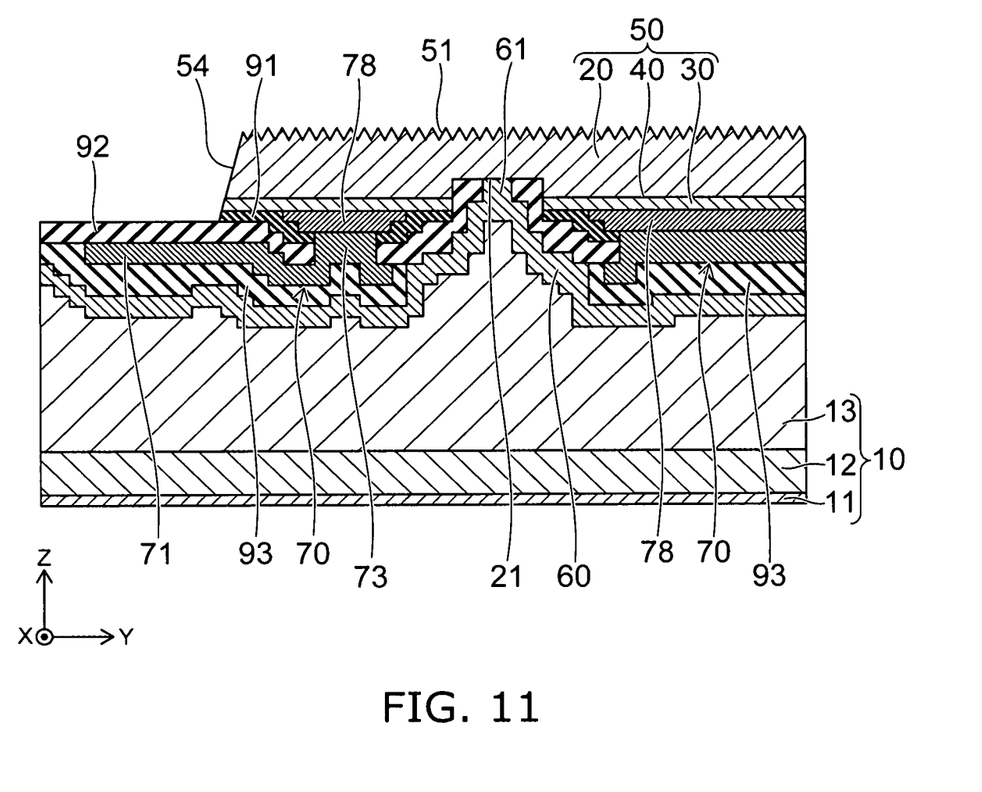

The metal layer 110 is removed; and the first surface 51 of the semiconductor layer 50 is exposed as shown in FIG. 10. By removing a portion of the first surface 51 by performing, for example, wet etching of the exposed first surface 51, unevenness processing of the first surface 51 is performed as shown in FIG. 11; and the first surface 51 is roughened.

After the roughening of the first surface 51, the insulating layer 94 that covers the first surface 51 and the first side surface 54 of the semiconductor layer 50 is formed as shown in FIG. 2. An opening is formed by selectively removing a portion of the insulating layer 92 positioned above the first portion 71 of the second conductive layer 70; and the pad electrode 81 is formed in the opening. The formation of the opening of the insulating layer 92 is performed by etching.

For example, the insulating layer 92 is etched easily by utilizing RIE (Reactive Ion Etching) to etch the semiconductor layer 50. For example, if the insulating layer 92 is etched by RIE, the first portion 71 of the conductive layer 70 positioned under the insulating layer 92 also is etched easily. Therefore, there is a risk that the surface of the first portion 71 may become rough which may cause a contact defect between the conductive layer 70 and the pad electrode 81 disposed in contact with the first portion 71. Also, if the insulating layer 92 is removed and the conductive layer 70 is exposed undesirably from under the insulating layer 92, ions that are included in the etchant undesirably are attracted toward the conductive layer 70 side when etching to roughen the first surface 51 of the semiconductor layer 50. Therefore, there is a risk that the first surface 51 cannot be etched uniformly; and a patterning unevenness may occur in the first surface 51. Although the consumption of the insulating layer 92 due to the etching can be prevented if the insulating layer 92 is set to be thick, a thicker insulating layer 92 may cause a cost increase.

According to the embodiment, the semiconductor layer 50 is removed by wet etching using the first etchant; therefore, the etching of the insulating layer 92 can be suppressed compared to the case where RIE is used. Therefore, a thicker insulating layer 92 is unnecessary; and a cost reduction is possible. Also, the etching of the conductive layers can be prevented because the first portion 71 of the conductive layer 70 under the insulating layer 92 is not exposed.

Because wet etching is isotropic etching, the etching progresses also in a lateral direction (in the cross section illustrated in FIG. 8, the Y-direction) crossing the thickness direction of the semiconductor layer 50 (the Z-direction) compared to RIE which is anisotropic etching. Then, the time of being exposed to the etchant is longer for the upper portion of the semiconductor layer 50 than the lower portion; and the recessed amount of the semiconductor layer 50 in the Y-direction easily can be larger for the upper portion than for the lower portion. In other words, the first side surface 54 of the semiconductor layer 50 has a taper. As shown in FIG. 3, the angle θ3 which is the corner portion between the first side surface 54 and the first surface 51 is obtuse; and the coverage of the insulating layer 94 for the corner portion can be increased.

Wet etching is inexpensive compared to RIE for which it is necessary to electrically discharge inside a depressurized space. According to the embodiment, the removal of the semiconductor layer 50, the removal of the resist layer 120, and the removal of the metal layer 110 are performed by wet etching. Also, patterning of the metal layer 110 is unnecessary. Thus, according to the embodiment, a method for manufacturing a light-emitting element in which the shape controllability of the semiconductor layer 50 also is excellent can be disposed while simplifying the processes and suppressing side etching (over-etching) of the semiconductor layer 50 by interposing the metal layer 110 as an adhesion layer between the semiconductor layer 50 and the resist layer 120.

The metal layer 110 includes at least one selected from the group consisting of Ti, Ni, Sn, and Al. Among these elements, Ti is superior for the adhesion with the nitride semiconductor layer; and the effect of suppressing the side etching amount of the semiconductor layer 50 due to the first etchant can be increased.

In the case where the metal layer 110 is too thick, it takes time until the semiconductor layer 50 is exposed to the first etchant; and the time necessary for manufacturing lengthens. Therefore, it is favorable for the thickness of the metal layer 110 to be not less than 1 nm and not more than 5 nm. As described above, according to the embodiment, the metal layer 110 that is disposed between the resist layer 120 and the semiconductor layer 50 has an adhesion force to the semiconductor layer 50 that is higher than the adhesion force between the resist layer 120 and the semiconductor layer 50. Also, using the resist layer 120 as a mask, the metal layer 110 and the semiconductor layer 50 are etched using the first etchant by which the insulating layer 92 positioned below the opening 120a of the resist layer 120 is not etched easily. Thereby, the side surface configuration of the semiconductor layer 50 can be controlled while simplifying the processes without removing the members that should remain.

The embodiments of the present disclosure have been described with reference to specific examples. However, the present disclosure is not limited to these specific examples. Based on the above-described embodiments of the present disclosure, all embodiments that can be implemented with appropriately design modification by one skilled in the art are also within the scope of the present disclosure as long as the gist of the present disclosure is included. Besides, within the scope of the spirit of the present disclosure, one skilled in the art can conceive various modifications, and the modifications fall within the scope of the present disclosure.

What is claimed is:

1. A method for manufacturing a light-emitting element, comprising:
   preparing a structure body, which includes a base body, the structure body being prepared by
      disposing a conductive layer above the base body,
      disposing an insulating layer on and above the conductive layer,
      disposing a semiconductor layer on and above the insulating layer, and above the conductive layer, the semiconductor layer being made of a nitride semiconductor, and
      disposing a metal layer on and above the semiconductor layer;
   forming a resist layer on the metal layer, the resist layer having an opening;
   exposing a portion of the insulating layer from under the metal layer and the semiconductor layer by removing, through the opening, a portion of the metal layer and a portion of the semiconductor layer by wet etching using a first etchant, etching rates of the first etchant for the metal layer and the semiconductor layer each being higher than an etching rate of the first etchant for the insulating layer;
   removing the resist layer by wet etching after the removing of the metal layer portion and the semiconductor layer portion; and
   after the removing of the resist layer, removing a remaining portion of the metal layer while causing the insulating layer exposed from under the metal layer and the semiconductor layer to remain, the opening of the resist layer being positioned directly on the conductive layer.

2. The method according to claim 1, wherein the metal layer includes at least one selected from the group consisting of Ti, Ni, Sn, and Al.

3. The method according to claim 2, wherein the metal layer is made of Ti.

4. A method for manufacturing a light-emitting element, comprising:
   preparing a structure body, the structure body including a base body, a conductive layer disposed above the base body, an insulating layer disposed on the conductive layer, a semiconductor layer disposed on the insulating layer and made of a nitride semiconductor, and a metal layer disposed on the semiconductor layer;
   forming a resist layer on the metal layer, the resist layer having an opening;
   exposing a portion of the insulating layer from under the metal layer and the semiconductor layer by removing, through the opening, a portion of the metal layer and a portion of the semiconductor layer by wet etching using a first etchant, etching rates of the first etchant for the metal layer and the semiconductor layer each being higher than an etching rate of the first etchant for the insulating layer;
   removing the resist layer by wet etching after the removing of the metal layer portion and the semiconductor layer portion; and
   after the removing of the resist layer, removing a remaining portion of the metal layer while causing the insulating layer exposed from under the metal layer and the semiconductor layer to remain, the opening of the resist layer being positioned directly on the conductive layer, wherein a thickness of the metal layer is not less than 1 nm and not more than 5 nm.

5. The method according to claim 3, wherein a thickness of the metal layer is not less than 1 nm and not more than 5 nm.

6. The method according to claim 1, further comprising, after the removing of the remaining portion of the metal layer while causing the insulating layer to remain, performing unevenness processing of a surface of the semiconductor layer by removing a portion of the surface of the semiconductor layer by wet etching.

7. The method according to claim 2, further comprising, after the removing of the remaining portion of the metal layer while causing the insulating layer to remain, performing unevenness processing of a surface of the semiconductor layer by removing a portion of the surface of the semiconductor layer by wet etching.

8. The method according to claim 4, further comprising, after the removing of the remaining portion of the metal layer while causing the insulating layer to remain, performing unevenness processing of a surface of the semiconductor layer by removing a portion of the surface of the semiconductor layer by wet etching.

9. The method according to claim 1, wherein the first etchant includes phosphoric acid.

10. The method according to claim 2, wherein the first etchant includes phosphoric acid.

11. The method according to claim 4, wherein the first etchant includes phosphoric acid.

12. A method for manufacturing a light-emitting element, comprising:

preparing a structure body, the structure body including a base body, a conductive layer disposed above the base body, an insulating layer disposed on the conductive layer, a semiconductor layer disposed on the insulating layer and made of a nitride semiconductor, and a metal layer disposed on the semiconductor layer;

forming a resist layer on the metal layer, the resist layer having an opening;

exposing a portion of the insulating layer from under the metal layer and the semiconductor layer by removing, through the opening, a portion of the metal layer and a portion of the semiconductor layer by wet etching using a first etchant, etching rates of the first etchant for the metal layer and the semiconductor layer each being higher than an etching rate of the first etchant for the insulating layer;

removing the resist layer by wet etching after the removing of the metal layer portion and the semiconductor layer portion; and after the removing of the resist layer, removing a remaining portion of the metal layer while causing the insulating layer exposed from under the metal layer and the semiconductor layer to remain, the opening of the resist layer being positioned directly on the conductive layer, wherein a second etchant is used in the removing of the remaining portion of the metal layer, an etching rate of the second etchant for the metal layer being higher than an etching rate of the second etchant for the insulating layer.

13. The method according to claim 2, wherein a second etchant is used in the removing of the remaining portion of the metal layer, an etching rate of the second etchant for the metal layer being higher than an etching rate of the second etchant for the insulating layer.

14. The method according to claim 4, wherein a second etchant is used in the removing of the remaining portion of the metal layer, an etching rate of the second etchant for the metal layer being higher than an etching rate of the second etchant for the insulating layer.

15. The method according to claim 1, wherein the conductive layer includes Al.

16. The method according to claim 2, wherein the conductive layer includes Al.

17. The method according to claim 4, wherein the conductive layer includes Al.

* * * * *